(12) United States Patent
Fujibe et al.

(10) Patent No.: US 8,555,098 B2
(45) Date of Patent: Oct. 8, 2013

(54) SEMICONDUCTOR CIRCUIT WITH LOAD BALANCE CIRCUIT

(75) Inventors: Tasuku Fujibe, Tokyo (JP); Yoshihito Nagata, Tokyo (JP); Masakatsu Suda, Tokyo (JP)

(73) Assignee: Advantest Corporation, Tokyo (JP)

( * ) Notice: Subject to any disclaimer, the term of this patent is extended or adjusted under 35 U.S.C. 154(b) by 211 days.

(21) Appl. No.: 12/996,756

(22) PCT Filed: Jun. 9, 2008

(86) PCT No.: PCT/JP2008/001469
§ 371 (c)(1),
(2), (4) Date: Jan. 19, 2011

(87) PCT Pub. No.: WO2009/150694
PCT Pub. Date: Dec. 17, 2009

(65) Prior Publication Data
US 2011/0109377 A1    May 12, 2011

(51) Int. Cl.
*G06F 1/00* (2006.01)
*G06F 1/32* (2006.01)

(52) U.S. Cl.
CPC .................................. *G06F 1/3203* (2013.01)
USPC .......................................... 713/323; 713/300

(58) Field of Classification Search
USPC ................. 713/300–340; 324/750.01–762.01
See application file for complete search history.

(56) References Cited

U.S. PATENT DOCUMENTS

| | | | |
|---|---|---|---|
| 6,433,567 B1 * | 8/2002 | Okayasu .................. | 324/750.03 |
| 6,657,455 B2 * | 12/2003 | Eldridge et al. ......... | 324/754.07 |
| 7,012,444 B2 * | 3/2006 | Kojima .................... | 324/762.01 |
| 7,046,027 B2 * | 5/2006 | Conner .................... | 324/756.03 |
| 7,482,829 B2 * | 1/2009 | Hirata et al. ............. | 324/762.01 |
| 2008/0116901 A1 | 5/2008 | Suda et al. ............... | 324/555 |

FOREIGN PATENT DOCUMENTS

| | | |
|---|---|---|
| JP | 59-194229 | 11/1984 |
| JP | 59-194229 A | 11/1984 |
| JP | 11-74768 A | 3/1999 |
| JP | 2001-7297 A | 1/2001 |
| JP | 2002-350503 | 12/2002 |
| JP | 2002-350503 A | 12/2002 |
| JP | 2004-125552 A | 4/2004 |
| JP | 2004-125573 A | 4/2004 |
| JP | 2005-190342 | 7/2005 |
| JP | 2005-190342 A | 7/2005 |
| TW | 200405936 A | 4/2004 |
| WO | 2006/035604 A1 | 4/2006 |

OTHER PUBLICATIONS

Office Action for corresponding Korean App. No. 10-2011-7000488 dated Dec. 20, 2011.
PCT International Search Report for PCT Application No. PCT/JP2008/001469 mailed on Dec. 9, 2008, with an English-language translation.
PCT Written Opinion for PCT Application No. PCT/JP2008/001469 mailed on Dec. 9, 2008, with an English-language translation.
PCT International Preliminary Report on Patentability for PCT Application No. PCT/JP2008/001469 mailed on Dec. 23, 2010, with an English-language translation.
Office Action dated Feb. 4, 2013 for related Taiwanese Patent Application No. 98119225 and its English summary.

* cited by examiner

*Primary Examiner* — Raymond Phan
(74) *Attorney, Agent, or Firm* — Ladas & Parry, LLP

(57) ABSTRACT

A circuit block operates while receiving a clock from an external circuit. A load balance circuit is connected to a shared power supply terminal together with the circuit block, and provides predetermined power consumption. A clock detection unit detects input of the clock from an external circuit. When the clock detection unit detects stopping of input of the clock, the load balance circuit is switched to the active state.

21 Claims, 6 Drawing Sheets

20a

SEMICONDUCTOR CIRCUIT WITH LOAD BALANCE CIRCUIT

CROSS REFERENCE TO RELATED APPLICATIONS

This application is the U.S. National Stage of International Patent Application No. PCT/JP2008/001469 filed on Jun. 9, 2008 and claims priority thereto, the disclosure of which is hereby incorporated by reference in its entirety.

BACKGROUND OF THE INVENTION

1. Field of the Invention

The present invention relates to a semiconductor integrated circuit configured to operate according to a multi-level digital signal and a test apparatus thereof, and particularly to a technique for providing stable operation of a power supply.

2. Description of the Related Art

In a case in which a semiconductor integrated circuit such as a CPU (Central Processing Unit), DSP (Digital Signal Processor), memory, etc., which is provided using the CMOS (Complementary Metal Oxide Semiconductor) technology, is tested using a semiconductor test apparatus (which will be referred to as the "test apparatus" hereafter), the test apparatus supplies a test pattern to such a semiconductor integrated circuit, which is a device under test (which will be referred to as the "DUT" hereafter), so as to instruct the DUT to perform predetermined signal processing, and compares the data obtained as a result of the signal processing with an expected value, thereby performing quality judgment.
[Patent Document 1]
International Publication WO 06/035604 pamphlet
[Patent Document 2]
Japanese Patent Application Laid Open No. H11-74768
[Patent Document 3]
Japanese Patent Application Laid Open No. 2004-125552
[Patent Document 4]
Japanese Patent Application Laid Open No. 2004-125573

Upon receiving a test pattern, each flip-flop or each latch included in the DUT performs signal processing. In this state, current consumption occurs. On the other hand, when the signal processing is stopped, the circuit enters a static state, leading to reduction in the current consumption. Accordingly, in a case in which a test pattern is intermittently supplied to the DUT, current consumption by the DUT is also intermittent, and current flows in a burst manner. A power supply circuit arranged to supply power supply voltage to such a DUT is configured using a regulator. With an ideal power supply, such an arrangement is capable of supplying a constant power supply voltage regardless of the amount of the load current. However, in practice, such a power supply circuit has a significant output impedance, and has limited responsiveness to load changes. Accordingly, in a case in which the current consumption of the DUT changes in a burst manner, the power supply voltage changes according to the change in the current consumption of the DUT.

Such change in the power supply voltage has an effect on the operations of other circuit blocks included in the test apparatus, such as a pattern generator configured to generate a pattern signal to be supplied to the DUT, a timing generator configured to control the pattern transition timing, etc. This leads to a problem of jitter being superimposed on the signal thus generated.

If there is a block that operates intermittently in the internal circuit of the test apparatus, it leads to fluctuation in the power supply voltage to be supplied to such a block, which is also a problem.

SUMMARY OF THE INVENTION

The present invention has been made in order to solve the aforementioned problems. Accordingly, it is a general purpose of the present invention to provide a semiconductor integrated circuit and a test apparatus which are capable of suppressing fluctuation in the power supply voltage during testing.

A semiconductor integrated circuit according to an embodiment of the present invention comprises: a circuit block configured to operate while receiving a multi-level digital signal from an external circuit; a load balance circuit connected to a shared power supply terminal together with the circuit block, and configured to provide predetermined power consumption; and a detection unit configured to detect input of the multi-level digital signal from an external circuit. When the detection unit detects stopping of input of the multi-level digital signal, the load balance circuit is switched to an active state.

When a multi-level digital signal is input to the semiconductor integrated circuit, the semiconductor integrated circuit enters the operation state, leading to increased current consumption. On the other hand, its current consumption reduces when input of the multi-level digital signal is stopped. Thus, by detecting whether or not a multi-level digital signal is input, such an arrangement is capable of appropriately controlling the load balance circuit. Thus, such an arrangement is capable of maintaining the current consumption of the semiconductor integrated circuit at a constant level, thereby suppressing fluctuation in the power supply voltage.

Also, the detection unit may detect the clock signal as a multi-level digital signal. When a clock is input to a digital circuit, the current consumption of the digital circuit increases. Thus, such an arrangement is capable of appropriately controlling the load balance circuit.

Also, the detection unit may detect, as the multi-level digital signal, a binary data signal that is set to either high level or low level. Examples of such binary data signals include pseudo-random signals, address signals, and data signals.

Also, the detection unit may increase the duty ratio of each pulse of the multi-level digital signal to 100% or more, and may output, as a signal that indicates whether or not the multi-level signal is input, a signal including the pulses having a duty ratio thus increased.

With such an arrangement, with the pulses of the multi-level digital signal input in succession, the pulses having an increased duty ratio are overlapped, thereby providing a signal the level of which is fixed at high level. Thus, such an arrangement is capable of appropriately detecting whether or not a multi-level digital signal is input.

Also, the detection unit may comprise: multiple delay circuits; and multiple two-input logical gates. Also, the multiple delay circuits and the multiple two-input logical gates may be cascade-connected in an alternating manner. Also, the multi-level digital signal is input to the balance of the input terminals of the two-input logical gates.

With such an arrangement, the processing is repeatedly performed in which a multi-level digital signal is delayed, the resulting multi-level digital signal thus delayed is combined with the original multi-level digital signal, the multi-level digital signal thus combined is delayed again, and the resulting multi-level digital signal thus delayed is combined with the original multi-level digital signal. Thus, such an arrangement is capable of generating a signal having a predetermined level that is fixed when the multi-level digital signal is supplied.

Also, the logical gate may generate the logical AND of two input signals.

Also, the semiconductor integrated circuit according to an embodiment may further comprise: an edge detection circuit configured to detect an edge of the multi-level digital signal, and to generate a pulse sequence which is set to a predetermined level every time an edge is detected. Also, the pulse sequence thus generated, instead of the multi-level digital signal, may be input to the balance of the input terminals of the multiple two-input logical gates.

Such an arrangement is capable of appropriately generating a signal which indicates that supply of the multi-level digital signal is stopped, regardless of whether the electric potential of the multi-level digital signal supplied from an external circuit is fixed at low level or high level after supply of the multi-level digital signal is stopped.

Also, the detection unit may comprise: a multi-stage delay circuit configured to apply multiple delay steps to the multi-level digital signal so as to generate multiple delayed digital signals to which different delays have been applied; and a detection processing unit configured to perform predetermined signal processing on the multiple delayed digital signals output from the multi-stage delay circuit so as to judge whether or not the multi-level digital signal is input.

Also, the detection processing unit may perform a logical operation on the multiple delayed digital signals, and may output the operation result as a detection result of whether or not input of the multi-level digital signal is detected.

Also, the detection processing unit may generate the logical OR of the multiple delayed digital signals.

Also, a semiconductor integrated circuit according to an embodiment may further comprise an edge detection circuit configured to detect an edge of the multi-level digital signal, and to generate a pulse sequence which is set to a predetermined level every time an edge is detected. Also, the multi-stage delay circuit may apply multiple delay steps to the pulse sequence instead of to the multi-level digital signal.

Also, the detection processing unit may integrate the multiple delayed digital signals, and may output the integration result as a detection result of whether or not input of the multi-level digital signal is detected. With such an arrangement in which multiple delayed digital signals are integrated, the integrated value generated when the multi-level digital signal is supplied is greater than the integrated value generated when supply of the multi-level digital signal is stopped. Thus, such an arrangement is capable of judging, based upon the integration result, whether or not the multi-level digital signal is input.

Also, the load balance circuit may be configured so as to be capable of controlling the power consumption thereof. Also, the semiconductor integrated circuit may further comprise: a state detection circuit configured to detect the state of the semiconductor integrated circuit, and to generate a state detection signal that corresponds to the state thus detected; and a power control circuit configured to adjust the power consumption due to the load balance circuit such that the value of the state detection signal when the load balance circuit is in an active state matches the value of the state detection signal when the load balance circuit is in an inactive state.

By adjusting the current consumption of the load balance circuit, such an arrangement is capable of suppressing fluctuation in the overall current consumption of the semiconductor integrated circuit and the load balance circuit that occurs due to switching the load balance circuit between the active state and the inactive state.

Also, the state detection circuit may comprise: an oscillator connected to a shared power supply terminal together with the circuit block, and configured to oscillate at a frequency that corresponds to the power supply voltage at the power supply terminal; and a frequency counter configured to measure the frequency of the oscillator. Also, the state detection circuit may output a state detection signal that corresponds to the frequency thus measured.

Also, the frequency counter may measure the frequency for a predetermined period after the detection unit detects stopping of input of the multi-level digital signal so as to generate the state detection signal when the load balance signal is in the active state. Also, the frequency counter may measure the frequency for a predetermined period when the load balance circuit is in the inactive state so as to generate the state detection signal when the load balance circuit is in the inactive state. Also, an arrangement may be made in which, when an external trigger signal is asserted, the frequency is measured for the inactive state. Also, the power control circuit may adjust the power consumption due to the load balance circuit such that the difference in the frequency between the active and the inactive states of the load balance circuit becomes minimal.

When the state transits to the stopped state from the state in which the multi-level digital signal is supplied, the load balance circuit is turned on, and accordingly, the current consumption changes. In this stage, in some cases, the power supply voltage fluctuates due to fluctuation in the voltage drop that occurs at the internal impedance of the power supply. By monitoring the state of the power supply voltage during a fluctuation period so as to control the load balance circuit, such an arrangement is capable of appropriately suppressing fluctuation in the power supply voltage.

Another embodiment of the present invention relates to a test apparatus. The test apparatus comprises: a power supply circuit configured to generate a power supply voltage; a multi-strobe generating unit configured to generate a multi-strobe signal including multiple pulses having edges at different timings; a circuit block configured to receive the multi-strobe signal, and to perform predetermined signal processing; a load balance circuit configured to provided predetermined power consumption; and a multi-strobe detection unit configured to receive the multi-strobe signal, and to detect whether or not the multi-strobe signal is being generated by the multi-strobe generating unit. At least the circuit block and the load balance circuit each operate while receiving the shared power supply voltage. When the multi-strobe detection unit detects stopping of generation of the multi-strobe signal, the load balance circuit is set to an active state.

With such an embodiment, when the multi-strobe signal is supplied, the current consumption of the circuit block increases. On the other hand, the current consumption of the circuit block reduces when supply of the multi-strobe signal is stopped. Thus, by detecting whether or not the multi-strobe signal is generated, such an arrangement is capable of appropriately controlling the load balance circuit. Thus, such an arrangement is capable of maintaining the current consumption that occurs in the test apparatus, thereby suppressing fluctuation in the power supply voltage generated by the power supply circuit. As a result, such an arrangement is capable of reducing jitter that occurs in the multi-strobe signal itself, and timing signals and pattern signals generated by other circuits.

Also, the multi-strobe detection unit may output, as a detection result, the logical OR of the multiple pulses included in the multi-strobe signal.

Also, the multi-strobe detection unit may integrate the multiple pulses included in the multi-strobe signal, and may output the integration result as a detection result.

Also, the load balance circuit may be configured so as to be capable of controlling the power consumption thereof. Also, the test apparatus may further comprise: a state detection unit configured to detect the state of the semiconductor integrated circuit, and to generate a state detection signal that corresponds to the state thus detected; and a power control circuit configured to adjust power consumption due to the load balance circuit such that the value of the state detection signal when the load balance circuit is in the active state matches the value of the state detection signal when the load balance circuit is in the inactive state.

Also, the state detection circuit may comprise: an oscillator configured to operate while receiving the power supply voltage; and a frequency counter configured to measure the frequency of the oscillator. Also, the state detection circuit may output the state detection signal that corresponds to the frequency thus measured.

Also, the frequency counter may measure the frequency for a predetermined period after the multi-strobe detection unit detects stopping of generation of the multi-strobe signal, so as to generate the state detection signal when the load balance circuit is in the active state. Also, the frequency counter may measure the frequency for a predetermined period when the load balance circuit is in the inactive state, so as to generate the state detection signal when the load balance circuit is in the inactive state. Also, an arrangement may be made in which, when an external trigger signal is asserted, the frequency is measured for the inactive state. Also, the power control circuit may adjust the power consumption due to the load balance circuit such that the difference in the frequency between the active and the inactive state of the load balance circuit becomes minimal.

Also, the circuit block may latch the input data with each edge of the multi-strobe signal. Also, the circuit block may perform processing on each data thus latched.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
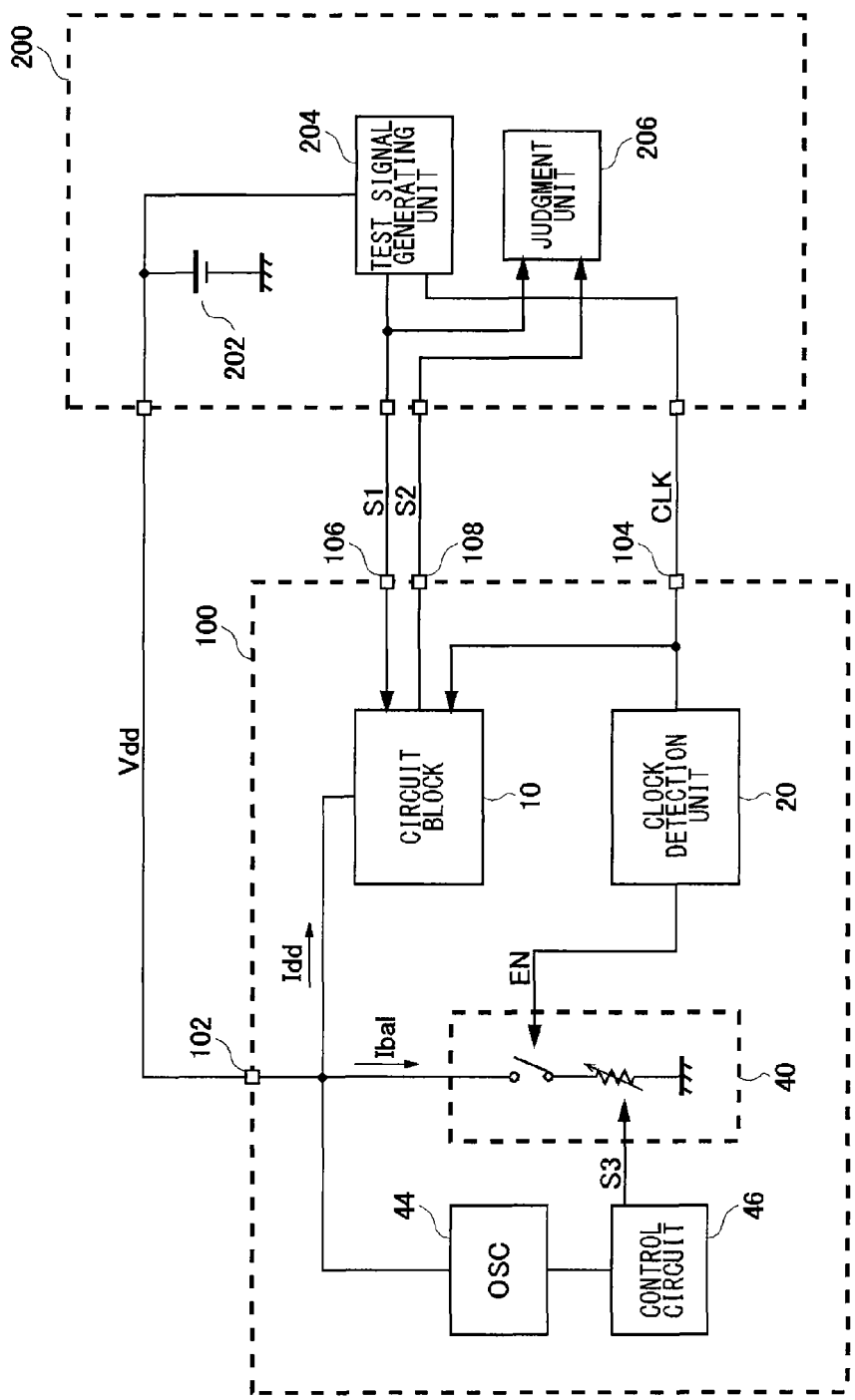
FIG. 1 is a circuit diagram which shows a configuration of a semiconductor integrated circuit according to a first embodiment.

Description will be made below regarding preferred embodiments according to the present invention with reference to the drawings. The same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

In the present specification, a state represented by the phrase "the member A is connected to the member B" includes a state in which the member A is indirectly connected to the member B via another member that does not affect the electric connection therebetween, in addition to a state in which the member A is physically and directly connected to the member B.

Description will be made in a first embodiment regarding a semiconductor integrated circuit having a mechanism for suppressing fluctuation in the voltage of a power supply provided as a built-in component of a test apparatus during testing. Next, description will be made regarding a test apparatus having a mechanism for suppressing fluctuation in the power supply voltage due to current consumption that occurs in the internal circuit of the test apparatus.

First Embodiment

FIG. 1 is a circuit diagram which shows a configuration of a semiconductor integrated circuit 100 according to the first embodiment. FIG. 1 also shows a test apparatus 200 configured to test the semiconductor integrated circuit 100, in addition to the semiconductor integrated circuit 100.

The semiconductor integrated circuit 100 includes a power supply terminal 102 configured to receive a power supply voltage Vdd, a clock terminal 104 configured to receive a clock CLK, a data input terminal 106 configured to receive data S1 from an external circuit, and a data output terminal 108 configured to output data S2 to an external circuit. The semiconductor integrated circuit 100 is configured as a function IC (Integrated Circuit) integrated on a single semiconductor substrate.

The semiconductor integrated circuit 100 includes a circuit block 10, a clock detection unit 20, a load balance circuit 40, a state detection circuit 44, and a power control circuit 46.

The circuit block 10 is a circuit configured to itself execute the operation of the semiconductor integrated circuit, and performs predetermined signal processing using a received power supply voltage Vdd and a clock CLK. The configuration and the operation of the circuit block 10 are not restricted in particular. That is to say, the semiconductor integrated circuit 100 may be configured as any of a CPU, DSP, or memory, or as another kind of digital circuit or digital/analog hybrid circuit.

The load balance circuit 40 is connected to the shared power supply terminal 102 together with the circuit block 10, and provides predetermined power (current) consumption. The load balance circuit 40 is arranged as a dummy load (current source) provided in order to maintain at a constant level the current supplied from an external circuit via the power supply terminal 102. The load balance circuit 40 has a configuration which allows the state to be switched between an ON state (active state) and an OFF state (inactive state) according to an enable signal EN supplied from an external circuit.

The clock detection unit 20 detects input of the clock CLK supplied from an external circuit. The clock detection unit 20 generates the enable signal EN which is set to a predetermined level (high level) when it detects the clock CLK.

That is to say, when the clock detection unit 20 detects input of the clock CLK, the load balance circuit 40 enters the active state. In the active state, the load balance circuit 40 provides current consumption (which will be referred to as "balance current Ibal" hereafter).

In many cases, the clock detection unit 20, the load balance circuit 40, the state detection circuit 44, and the power control circuit 46 are each a circuit that is used during testing. Also, these components may be used in a state in which the semiconductor integrated circuit 100 can be mounted on an end product.

The above is the basic configuration of the semiconductor integrated circuit 100. Description will be made regarding the operation of the semiconductor integrated circuit 100 during testing. During testing, the semiconductor integrated circuit 100 is mounted on a socket board (performance board) of the test apparatus 200. The test apparatus 200 includes a power supply circuit 202 configured to generate the power supply voltage Vdd to be supplied to the semiconductor integrated circuit 100 which is a DUT, a test signal generating unit 204 configured to supply a test signal S1 to the DUT, and a judgment unit 206 configured to perform quality judgment. The semiconductor integrated circuit 100 receives the test signal S1 supplied from the test signal generating unit 204, and performs predetermined signal processing. The test apparatus 200 reads out data S2 obtained as a result of the signal processing. The judgment unit 206 makes a comparison between an expected value that corresponds to the test signal S1 and the signal S2 thus generated by the semiconductor integrated circuit 100, thereby judging the quality of the semiconductor integrated circuit 100.

When the semiconductor integrated circuit 100 is tested, a clock CLK, which is used to operate the semiconductor integrated circuit 100, is output together with, or independent of, the test data S1.

When the semiconductor integrated circuit 100 performs signal processing using the input clock CLK, an amount of current Idd is consumed in the circuit block 10. When the operation of the semiconductor integrated circuit 100 is stopped, it reduces consumption of the current Idd that occurs in the circuit block 10. In this stage, if the load balance circuit 40 is not operated, the load as seen from the power supply circuit 202 side becomes light, leading to fluctuation in the power supply voltage Vdd. Such fluctuation in the power supply voltage Vdd leads to jitter being superimposed on various kinds of signals generated by the test signal generating unit 204.

The clock detection unit 20 of the semiconductor integrated circuit 100 judges whether or not the clock CLK is input. The clock detection unit 20 instructs the load balance circuit 40 to enter the active state during a period in which input of the clock CLK is stopped, i.e., during a period in which the operation of the circuit block 10 is stopped. As a result, the reduction in the current Idd due to the stopping of the operation of the circuit block 10 is canceled out by the balance current Ibal that flows through the load balance circuit 40. This maintains the load as seen from the power supply circuit 202 at a constant level. As a result, such an arrangement is capable of suppressing fluctuation in the power supply voltage Vdd, thereby providing stable operation of the test signal generating unit 204.

Figure 2:
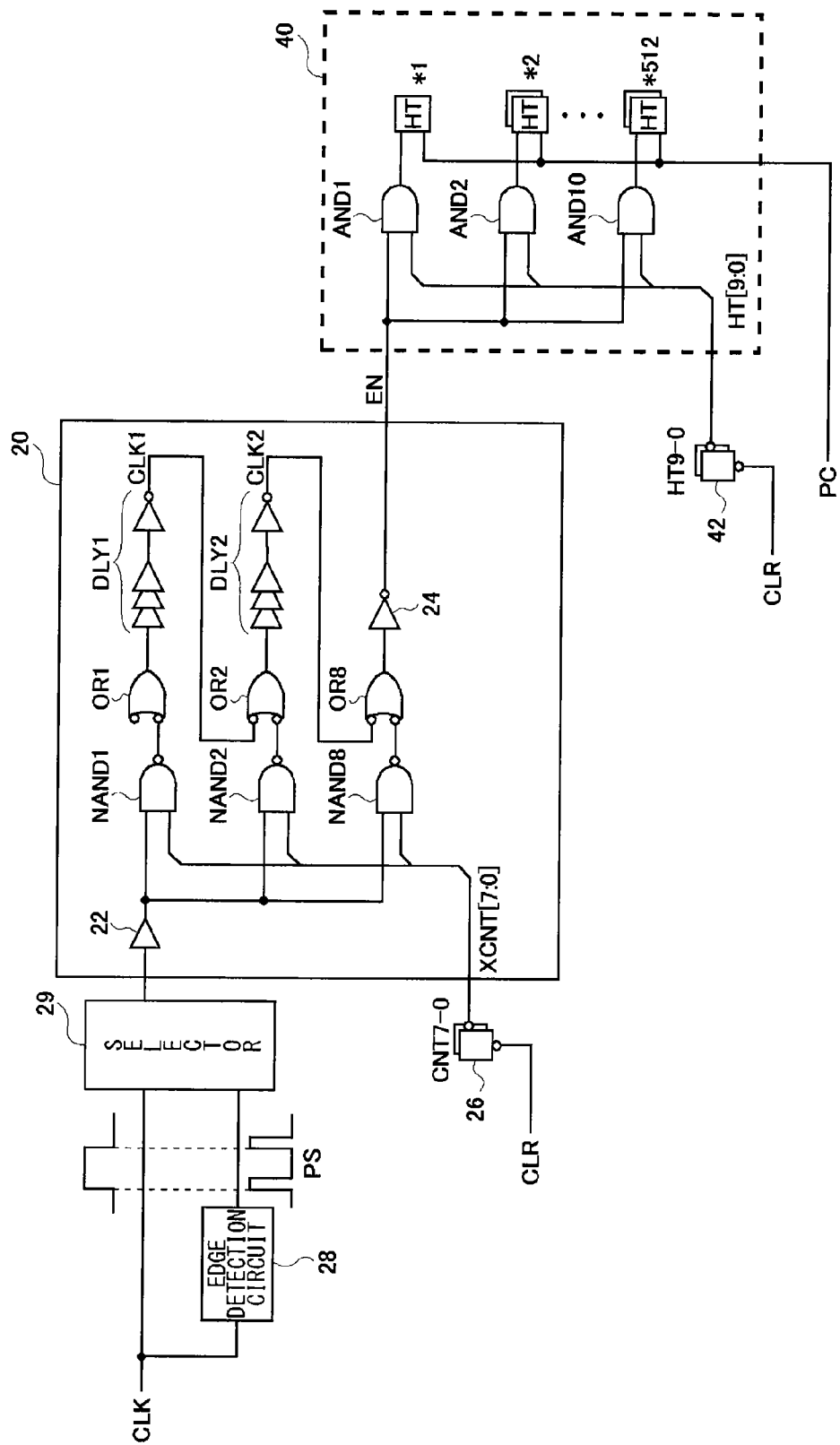
FIG. 2 is a circuit diagram which shows an example configuration of a clock detection unit and a load balance circuit.

FIG. 2 is a circuit diagram which shows example configurations of the clock detection unit 20 and the load balance circuit 40. The clock detection unit 20 includes an input buffer 22, an output buffer 24, multiple NAND gates NAND1 through NAND8, multiple OR gates OR1 through OR8, and multiple delay circuits DLY1 through DLY7 (a part of these components is not shown).

The input buffer 22 and the multiple NAND gates (NAND1 through NAND8) are arranged to distribute the clock CLK, and to independently switch on and off the clocks thus distributed. With the circuit shown in FIG. 2, the clock CLK is divided into a maximum of eight distributed clocks. The number of distributed clocks matches the number of OR gates arranged as downstream components.

The clock CLK is distributed to the multiple NAND gates via the input buffer 22. A control signal XCNT is input to the other input terminal of each of the gates NAND1 through NAND8. The control signal XCNT is stored in the register 26, and its level can be set via an external circuit. With attention to the i-th NAND gate NANDi, when the control signal XCNT[i−1] is low level, the path of the i-th NAND gate NANDi is disabled, thereby preventing the clock CLK from being distributed to the downstream components.

The multiple OR gates and the multiple delay circuits DLY1 through DLY7 are cascade-connected in an alternating manner. That is to say, the i-th delay circuit DLYi receives, as an input signal, the output signal CLKi of the i-th OR gate ORi. The output signal (which will also be referred to as the "delayed clock") CLKdi of the i-th delay circuit DLYi is input to one input terminal of the (i+1)-th OR gate.

The OR gates OR1 through OR8 receive, as input signals and via the other terminals thereof, the respective clocks distributed by the gates NAND1 through NAND8. The output signal of the final-stage OR gate OR8 is output as an enable signal EN via the output buffer 24.

Figure 3:
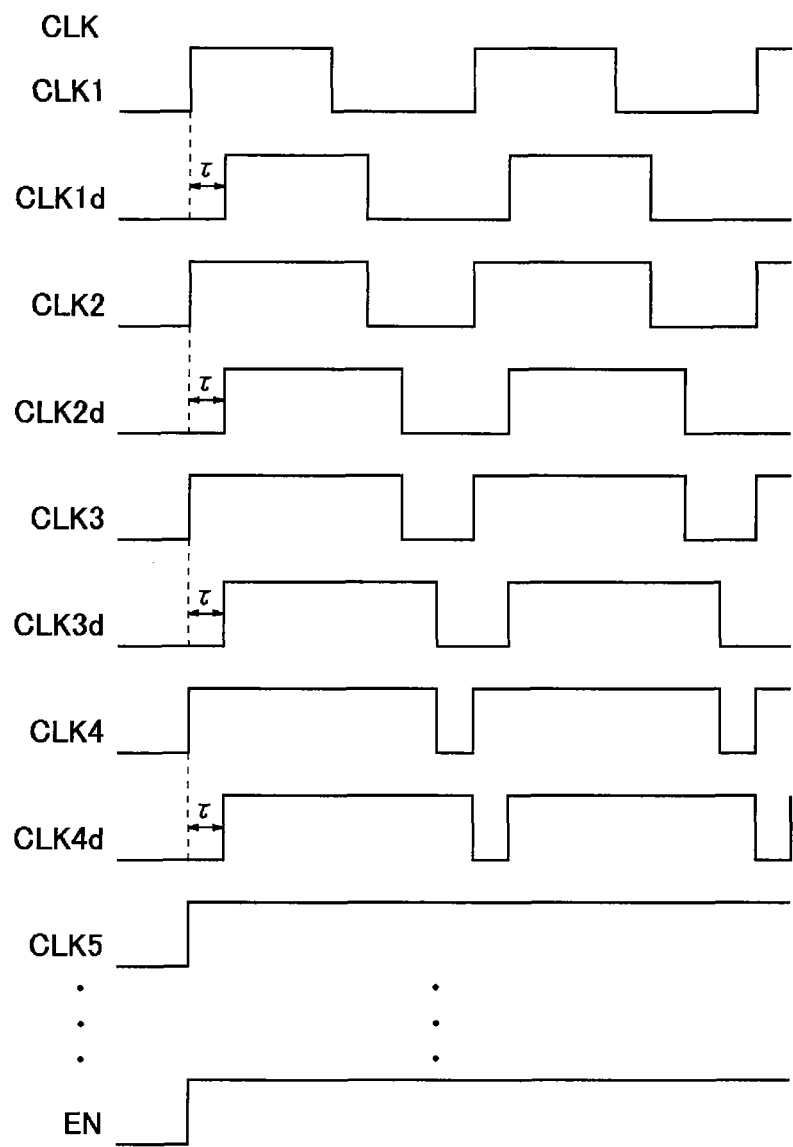
FIG. 3 is a time chart which shows the operation of the clock detection unit shown in FIG. 2.

FIG. 3 is a time chart which shows the operation of the clock detection unit 20 shown in FIG. 2. The output signal CLKi of the i-th OR gate is delayed by a predetermined period of time τ by means of the i-th delay circuit DLYi. The next-stage OR gate OR(i+1) calculates the logical OR of the delayed clock CLKid and the original clock CLK. By sequentially performing this processing in increments of i, the original clock CLK is subjected to smoothing processing, thereby generating the enable signal EN.

That is to say, the clock detection unit 20 repeatedly performs the processing in which the delayed clock CLK is combined with the original clock CLK, the clock thus combined is delayed again, and the combined clock thus delayed is combined with the original clock. Thus, the clock detection unit 20 is capable of generating a signal which is set to a predetermined level while the clock is supplied.

Also, by inverting the signals, an arrangement may be made employing other kinds of two-input logical gates instead of the OR gates, thereby providing the same functions.

Referring to the time chart shown in FIG. 3, the clock detection unit 20 shown in FIG. 2 can be understood to be a circuit configured to generate pulses obtained by delaying the clock CLK, and to integrate the resulting pulses.

Seen from a different point of view, the following comprehensive concept can be understood of the clock detection operation of the clock detection unit 20. That is, the clock detection unit 20 stretches the duty ratio of each pulse of the clock CLK to 100% or more. With such an arrangement, the clock detection unit 20 outputs a signal including the pulses with an increased width as a signal (EN) that indicates whether or not input of the clock CLK is detected.

Returning to FIG. 2, the enable signal EN is supplied to the load balance circuit 40 arranged as a downstream circuit. The load balance circuit 40 includes multiple (for example, ten) load circuits HT each of which is capable of independently switching on and off, and AND gates AND1 through AND10 provided in increments of load circuits HT. The load balance circuit 40 is configured so as to have controllable power consumption. Each load circuit HT generates heat using electric power. Accordingly, the load circuit HT will be referred to as a "heater". When the output of the AND gate is high level, the corresponding heater HT is turned on, and when the output of the AND gate is low level, the corresponding heater HT is turned off.

The enable signal EN is input to one input terminal of each of the multiple AND gates AND1 through AND10. The multiple AND gates AND1 through AND10 receive, via their other input terminals, respective control signals HT[0] through HT[9]. The control signal HT[9:0] is stored in a register 42, and its level can be set via an external circuit. With attention to the i-th heater HTi, when the control signal HT[i−1] is low level, the i-th heater HTi is turned off regardless of the enable signal EN. When the control signal HT[i−1] is high level, the ON/OFF operation of the i-th heater HTi is controlled according to the level of the enable signal EN.

For example, with the unit of current consumption as 1, the current consumption provided by the multiple load circuits HT can be set to 1, 2, 4, . . . , 256, and 512. With such an arrangement, the overall current consumption provided by the load balance circuit 40 can be controlled to 1024 levels according to the 10-bit control signal HT[9:0]. Furthermore, the multiple heaters HT each receive, as an input signal, a power down control signal PC. Upon receiving the power down control signal PC, the load balance circuit 40 is turned off regardless of the register settings HT[9:0] and the enable signal EN. After the semiconductor integrated circuit 100 is mounted on an end product, by fixing the power down control signal PC at low level, such an arrangement is capable of forcibly stopping the operation of the load balance circuit 40.

The clock detection unit 20 shown in FIG. 2 normally operates in a condition in which the clock CLK is fixed at low level when it is in the stopped state. If the clock CLK is fixed at high level in the stopped state, the enable signal EN, which is to be fixed at low level in this state, is set to high level. This leads to a malfunction of the load balance circuit 40. In order to solve such a problem, an edge detection circuit 28 is provided, which enables the load balance circuit 40 to normally operate regardless of whether the clock CLK is fixed at high level or low level.

The edge detection circuit 28 detects an edge of the clock CLK, and generates a pulse sequence PS which is set to a predetermined level (high level) every time an edge is detected. A selector 29 selects either the clock CLK or the pulse sequence PS supplied from the edge detection circuit 28, and outputs the signal thus selected to the clock detection unit 20.

The pulse sequence PS, instead of the clock CLK, is input to the above-mentioned other input terminals of the multiple two-input logical gates (OR gates) via the input buffer 22 and the NAND gates. By selecting the pulse sequence PS by means of the selector 29, such an arrangement is capable of setting the enable signal EN to low level even if the clock CLK supplied from an external circuit is fixed at high level in the stopped state.

It should be noted that, in a case in which the clock CLK is fixed at low level in the state in which supply of the clock CLK is stopped, an arrangement may be made which does not include the edge detection circuit 28 and the selector 29. Conversely, in a case in which the clock CLK is fixed at high level in the state in which supply of the clock CLK is stopped, an arrangement may be made including only the edge detection circuit 28. It is needless to say that, with an arrangement including the edge detection circuit 28 and the selector 29 as shown in FIG. 2, such an arrangement is capable of appropriately detecting whether or not the clock is input regardless of whether the logical value of the clock CLK is high level or low level in the stopped state of the clock CLK.

Figure 4:
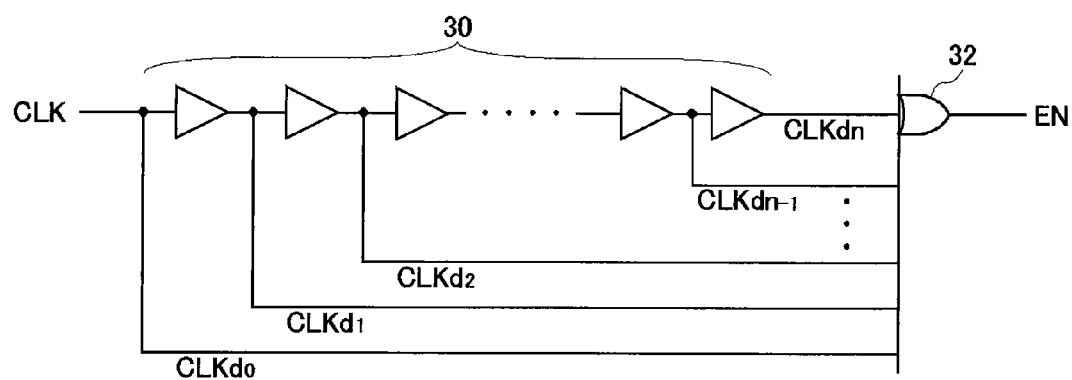
FIG. 4 is a circuit diagram which shows a configuration of a clock detection unit according to a modification.

The same operation as that of the clock detection unit 20 shown in FIG. 2 can also be realized by means of a clock detection unit 20a shown in FIG. 4. FIG. 4 is a circuit diagram which shows a configuration of the clock detection unit 20a according to a modification.

The clock detection unit 20a includes a multi-stage delay circuit 30 and a detection processing unit 32.

The multi-stage delay circuit 30 applies multiple delay steps to the clock CLK, thereby generating multiple delayed clocks CLKd0 through CLKdn to which different respective delays have been applied. The detection processing unit 32 performs predetermined signal processing on the multiple delayed clocks CLKd so as to judge whether the clock CLK is input. In a most simple configuration, the detection processing unit 32 can be configured as an OR gate. However, an arrangement may be made using other circuits.

Also, with the clock detection unit 20a shown in FIG. 4, whether or not the clock CLK is input can be appropriately judged in the same way as with the clock detection unit 20 shown in FIG. 2. The circuit shown in FIG. 2 repeatedly performs the delay processing and the predetermined signal processing (OR operation) in an alternating manner. In contrast, the circuit shown in FIG. 4 generates the delayed clocks CLKd at the same time, and the operation is performed once on the delayed clocks CLKd thus generated. That is to say, the difference in the operation between the clock detection unit 20a and the clock detection unit 20 is only in the order of the signal processing. The operations of the clock detection unit 20a and the clock detection unit 20 are substantially the same.

With a modification shown in FIG. 4, the edge detection circuit 28 shown in FIG. 2 may be arranged as an upstream component of the multi-stage delay circuit 30.

With attention to the operations of the circuits shown in FIG. 4 and FIG. 2, such a circuit repeatedly performs the processing in which a clock to which delay has been applied is combined with the original clock. That is to say, the operation of the clock detection unit 20 can be understood as processing for integrating the clocks. Seen from this point of view, the operation of the detection processing unit 32 shown in FIG. 4 can also be understood as an operation in which the multiple delayed clocks CLKd0 through CLKdn are integrated, and the resulting signal thus integrated is output as a detection result.

Next, returning to FIG. 1, description will be made regarding a technique for appropriately controlling the power consumption of the load balance circuit 40 in a case in which it is controllable.

The state detection circuit 44 detects the state of the semiconductor integrated circuit 100, and generates a state detection signal S3 that corresponds to the state thus detected.

The power control circuit 46 adjusts the power consumption provided by the load balance circuit 40 such that the value of the state detection signal S3 when the load balance circuit 40 is in the active state matches the value of the state detection signal S3 when the load balance circuit 40 is in the inactive state. The adjustment of the power consumption is performed by writing data to the register 42 shown in FIG. 2.

By controlling the current consumption amount of the load balance circuit 40 in addition to switching on and off the load balance circuit 40, such an arrangement is capable of suppressing fluctuation of the overall current consumption of the semiconductor integrated circuit and the load balance circuit that occurs due to switching the load balance circuit between the active state and the inactive state.

As the state detection circuit 44, a ring oscillator can be suitably employed, the oscillation frequency of which changes according to the power supply voltage Vdd and the temperature of the semiconductor integrated circuit 100. With such an arrangement, the state detection circuit 44 may be connected to the shared power supply terminal 102 together with the circuit block 10. Also, the state detection circuit 44 may include a frequency counter (not shown) configured to measure the frequency of the ring oscillator. The value of the frequency measured by the frequency counter is output to the power control circuit 46 as the state detection signal S3.

Figure 5:
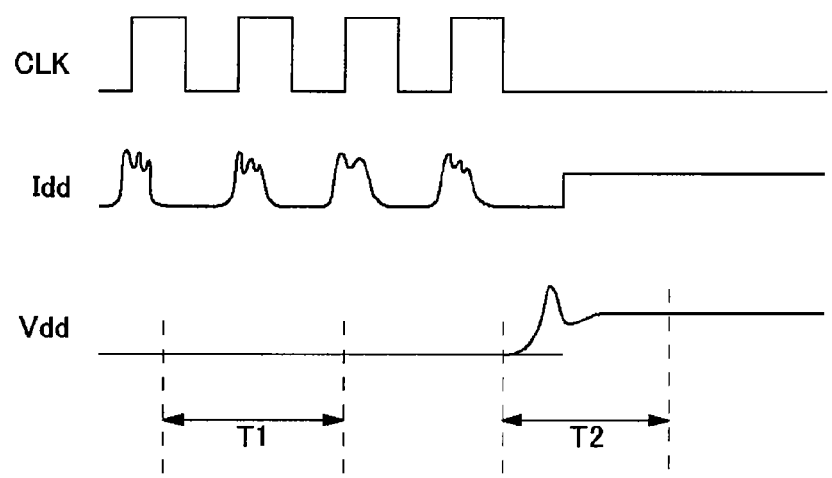
FIG. 5 is a time chart which shows a load regulation operation of the semiconductor integrated circuit shown in FIG. 1.

FIG. 5 is a time chart which shows load regulation provided by the semiconductor integrated circuit 100 shown in FIG. 1. During a period in which the clock CLK is input, consumption of the current Idd occurs in the circuit block 10. The current Idd has ripples that are synchronous with the clock CLK. When the clock CLK is stopped, the load balance circuit 40 enters the active state, thereby maintaining consumption of the current Idd at a constant level. At the timing at which the load balance circuit 40 switches from off to on, an overshoot of the power supply voltage Vdd occurs. Such an overshoot occurs on the time order of 100 µs to several ms.

Also, an arrangement may be made in which, during a predetermined period T2 after the clock detection unit 20 detects stopping of input of the clock CLK, the frequency counter measures the frequency so as to generate the state detection signal S3 when the load balance circuit 40 is in the active state. Furthermore, the frequency counter measures the frequency during a predetermined period T1 in which the clock CLK is input, and generates the state detection signal S3 when the load balance is in the inactive state. The power control circuit 46 controls the amount of current generated by the balance circuit 40 such that the state detection signals S3 thus acquired in these two periods T1 and T2 match each other.

When the state is switched from the state in which the clock CLK is stopped to the state in which the clock CLK is supplied, the current consumption fluctuates, leading to large fluctuation in the power supply voltage. By monitoring the state of the power supply voltage Vdd during a period in which it fluctuates, such an arrangement is capable of suitably suppressing fluctuation in the power supply voltage Vdd.

Description has been made in the first embodiment regarding an arrangement in which, with the semiconductor integrated circuit 100 according to the first embodiment, upon detecting stopping of input of the clock CLK, the load balance circuit 40 is switched to the active state. However, the present invention is not restricted to such an arrangement.

For example, an arrangement may be made in which input of a data signal such as a pseudo-random signal is detected instead of the clock CLK. The same detection method as that for detecting the clock CLK may be employed in such an arrangement. For example, where a pseudo random signal is input to the circuit, the density of the data transition points (edges) changes in a random manner, leading to fluctuation in the current consumption of the circuit. In order to solve such a problem, by detecting such a pseudo random signal so as to control the load balance circuit 40 instead of the clock, such an arrangement is capable of canceling out the fluctuation in the current consumption that occurs due to irregularities in the density of the data signal. Thus, such an arrangement is capable of suppressing fluctuation in the power supply voltage supplied to the semiconductor integrated circuit 100.

Also, with a circuit employing the CDR (Clock Data Recovery) method, the clock is reproduced based upon edges embedded in the data signal. With such an arrangement, detection of input of the data signal is equivalent to detection of the clock. Thus, such an arrangement is capable of maintaining current consumption at a constant level, thereby suppressing fluctuation in the power supply voltage.

Second Embodiment

Figure 6:
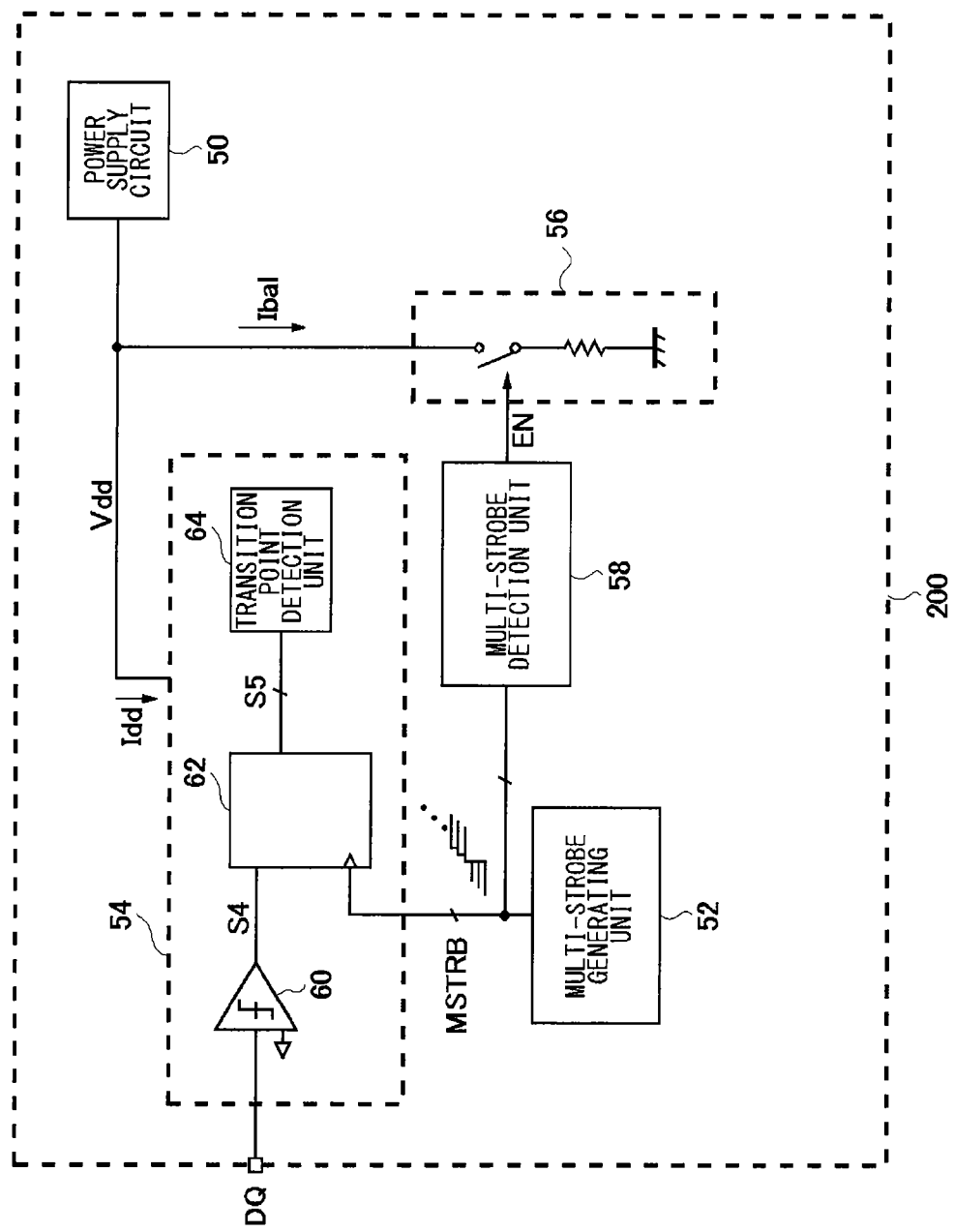
FIG. 6 is a block diagram which shows a configuration of a semiconductor test apparatus according to a second embodiment.

FIG. 6 is a block diagram which shows a configuration of a semiconductor test apparatus 200 according to a second embodiment. The test apparatus 200 includes a power supply circuit 50, a multi-strobe generating unit 52, a circuit block 54, a load balance circuit 56, and a multi-strobe detection unit 58.

The power supply circuit 50 is configured as a regulator or the like, and generates a power supply voltage Vdd. The multi-strobe generating unit 52 generates a multi-strobe signal MSTRB. The multi-strobe signal MSTRB includes multiple pulses having edges at different timings. The multi-strobe signal is generated by applying multiple delay steps to a single input strobe signal by means of the multi-stage delay circuit 30 as shown in FIG. 4.

The circuit block 54 receives the multi-strobe signal MSTRB, and performs predetermined signal processing. The content of the signal processing is not restricted in particular. Examples of such signal processing include an arrangement disclosed in Japanese Patent Application Laid Open No. 2004-125552 and an arrangement disclosed in Japanese Patent Application Laid Open No. 2004-125573.

The circuit block 54 includes a comparator 60, a latch circuit 62, and a transition point detection unit 64. The comparator 60 receives, as an input signal, a data signal DQ output from an unshown DUT. The comparator 60 compares the data signal DQ with a predetermined threshold voltage, thereby performing level judgment. The latch circuit 62 latches the signal S4, which represents the judgment result, at a timing of each pulse edge included in the multi-strobe signal MSTRB. As a result, the value of the data S5 thus latched changes with the level transition point of the data signal DQ as a boundary. The transition point detection unit detects the timing of the transition point of the data signal DQ based upon the data S5 thus latched. For example, by measuring the transition point for a certain number of data signals DQ, such an arrangement is capable of measuring jitter. By repeatedly performing such a test, such an arrangement is capable of performing eye margin measurement.

The load balance circuit 56 receives the shared power supply voltage Vdd in the same way as the circuit block 54, and consumes a predetermined amount of electric power. The function and the purpose of the load balance circuit 56 are the same as those of the load balance circuit 40 described in the first embodiment with reference to FIG. 1.

The multi-strobe signal MSTRB is also supplied to the multi-strobe detection unit 58. The multi-strobe detection unit 58 detects whether or not the multi-strobe signal MSTRB is being generated by the multi-strobe generating unit 52. When the multi-strobe detection unit 58 detects stopping of generation of the multi-strobe signal MSTRB, the multi-strobe detection unit 58 sets the enable signal EN to a predetermined level (high level), which switches the load balance circuit 56 to the active state (on).

When the multi-strobe signal MSTRB is supplied, the current consumption of the circuit block 54 increases, and its current consumption reduces when supply of the multi-strobe signal MSTRB is stopped. Thus, by detecting whether or not the multi-strobe signal MSTRB is generated, such an arrangement is capable of appropriately controlling the load balance circuit 40. Thus, such an arrangement is capable of maintaining the current consumption that occurs in the test apparatus 200, thereby suppressing fluctuation in the power supply voltage Vdd generated by the power supply circuit 50. As a result, such an arrangement is capable of reducing jitter that occurs in the multi-strobe signal itself, and timing signals and pattern signals generated by other circuits.

As described above, the multi-strobe signal MSTRB is a signal which is equivalent to the multiple delayed clock CLKd generated by the multi-stage delay circuit 30 shown in FIG. 4. Thus, by calculating the logical OR of the pulses included in the multi-strobe signal MSTRB in the same way as the detection processing unit 32 shown in FIG. 4, the multi-strobe detection unit 58 is capable of generating the enable signal EN.

Alternatively, the multi-strobe detection unit 58 may integrate the pulses included in the multi-strobe signal MSTRB, and may output the integration result as the enable signal EN.

Also, the edge detection circuit 28 as described in the first embodiment may be applied to the second embodiment. Also, by packaging the state detection circuit 44 and the power control circuit 46 in the test apparatus 200, such an arrangement provides further stabilization of the power supply.

Description has been made regarding the present invention with reference to the embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

Description has been made in the first embodiment regarding an arrangement in which the semiconductor integrated circuit 100 is to be tested by the test apparatus 200. Also, the semiconductor integrated circuit 100 itself may be configured as a function IC as a built-in component packaged in the test apparatus 200. In a case in which the test apparatus 200 includes an internal circuit block configured to operate while receiving a clock, by employing the semiconductor integrated circuit 100 shown in FIG. 1, such an arrangement is capable of maintaining a load on the power supply circuit 202 even if the clock is stopped.

Description has been made regarding the present invention with reference to the embodiments. However, the above-described embodiments show only the mechanisms and applications of the present invention for exemplary purposes only, and are by no means intended to be interpreted restrictively. Rather, various modifications and various changes in the layout can be made without departing from the spirit and scope of the present invention defined in appended claims.

What is claimed is:

1. A semiconductor integrated circuit comprising:
   a circuit block configured to operate while receiving a digital signal from an external circuit;
   a load balance circuit connected to a shared power supply terminal together with the circuit block, and configured to provide predetermined power consumption in an active state; and
   a detection unit configured to detect whether the digital signal is input to the circuit block from the external circuit or not, and to control a state of the load balance circuit according to a result of detection,
   wherein, when the detection unit detects stopping of input of the digital signal, the load balance circuit is switched to the active state.

2. A semiconductor integrated circuit according to claim 1, wherein the digital signal is configured as a clock signal.

3. A semiconductor integrated circuit according to claim 1, wherein the digital signal is configured as a binary data signal that is set to either high level or low level.

4. A semiconductor integrated circuit according to claim 1, wherein the detection unit increases the duty ratio of each pulse of the digital signal to 100% or more, and outputs, as a signal that indicates whether or not the signal is input, a signal including the pulses having a duty ratio thus increased.

5. A semiconductor integrated circuit according to claim 1, wherein the detection unit comprises:
   a plurality of delay circuits; and
   a plurality of two-input logical gates,
   wherein the plurality of delay circuits and the plurality of two-input logical gates are cascade-connected in an alternating manner,
   and wherein the digital signal is input to the balance of the input terminals of the two-input logical gates.

6. A semiconductor integrated circuit according to claim 1, wherein the detection unit comprises:
   a multi-stage delay circuit configured to apply a plurality of delay steps to the digital signal so as to generate a plurality of delayed digital signals to which different delays have been applied; and
   a detection processing unit configured to perform predetermined signal processing on the plurality of delayed digital signals output from the multi-stage delay circuit so as to judge whether or not the digital signal is input.

7. A semiconductor integrated circuit according to claim 1, wherein the load balance circuit is configured so as to be capable of controlling the power consumption thereof,
   and wherein the semiconductor integrated circuit further comprises:
   a state detection circuit configured to detect the state of the semiconductor integrated circuit, and to generate a state detection signal that corresponds to the state thus detected; and
   a power control circuit configured to adjust the power consumption due to the load balance circuit such that the value of the state detection signal when the load balance circuit is in an active state matches the value of the state detection signal when the load balance circuit is in an inactive state.

8. A semiconductor integrated circuit according to claim 4, further comprising:
   an edge detection circuit configured to detect an edge of the digital signal, and to generate a pulse sequence which is set to a predetermined level every time an edge is detected,
   and wherein the pulse sequence thus generated, instead of the digital signal, is input to the balance of the input terminals of the plurality of two-input logical gates.

9. A semiconductor integrated circuit according to claim 5, wherein the logical gate generates the logical OR of two input signals.

10. A semiconductor integrated circuit according to claim 6, wherein the detection processing unit generates the logical OR of the plurality of delayed digital signals, and outputs the calculation result as a detection result of whether or not input of the digital signal is detected.

11. A semiconductor integrated circuit according to claim 6, further comprising:
an edge detection circuit configured to detect an edge of the digital signal, and to generate a pulse sequence which is set to a predetermined level every time an edge is detected,
wherein the multi-stage delay circuit applies multiple delay steps to the pulse sequence instead of to the digital signal.

12. A semiconductor integrated circuit according to claim 6, wherein the detection processing unit integrates the plurality of delayed digital signals, and outputs the integration result as a detection result of whether or not input of the digital signal is detected.

13. A semiconductor integrated circuit according to claim 7, wherein the state detection circuit comprises:
an oscillator connected to a shared power supply terminal together with the circuit block, and configured to oscillate at a frequency that corresponds to the power supply voltage at the power supply terminal; and
a frequency counter configured to measure the frequency of the oscillator,
wherein the state detection circuit outputs a state detection signal that corresponds to the frequency thus measured.

14. A semiconductor integrated circuit according to claim 13, wherein the frequency counter measures the frequency for a predetermined period after the detection unit detects stopping of input of the digital signal so as to generate the state detection signal when the load balance signal is in the active state,
and wherein the frequency counter measures the frequency for a predetermined period when the load balance circuit is in the inactive state so as to generate the state detection signal when the load balance circuit is in the inactive state,
and wherein the power control circuit adjusts the power consumption due to the load balance circuit such that the difference in the frequency between the active and the inactive states of the load balance circuit becomes minimal.

15. A test apparatus comprising:
a power supply circuit configured to generate a power supply voltage;
a multi-strobe generating unit configured to generate a multi-strobe signal including a plurality of pulses having edges at different timings;
a circuit block configured to receive the multi-strobe signal, and to perform predetermined signal processing;
a load balance circuit configured to provide predetermined power consumption in an active state; and
a multi-strobe detection unit configured to receive the multi-strobe signal, and to detect whether or not the multi-strobe signal is being generated by the multi-strobe generating unit,
wherein at least the circuit block and the load balance circuit each operate while receiving the shared power supply voltage,
and wherein, when the multi-strobe detection unit detects stopping of generation of the multi-strobe signal, the load balance circuit is set to an active state.

16. A test apparatus according to claim 15, wherein the multi-strobe detection unit outputs, as a detection result, the logical OR of the plurality of pulses included in the multi-strobe signal.

17. A test apparatus according to claim 15, wherein the multi-strobe detection unit integrates the plurality of pulses included in the multi-strobe signal, and outputs the integration result as a detection result.

18. A test apparatus according to claim 15, wherein the load balance circuit is configured so as to be capable of controlling the power consumption thereof,
and wherein the test apparatus further comprises:
a state measurement unit configured to detect the state of the semiconductor integrated circuit, and to generate a state detection signal that corresponds to the state thus detected; and
a power control circuit configured to adjust power consumption due to the load balance circuit such that the value of the state detection signal when the load balance circuit is in the active state matches the value of the state detection signal when the load balance circuit is in the inactive state.

19. A test apparatus according to claim 18, wherein the state detection circuit comprises:
an oscillator configured to operate while receiving the power supply voltage; and
a frequency counter configured to measure the frequency of the oscillator,
wherein the state detection circuit outputs the state detection signal that corresponds to the frequency thus measured.

20. A test apparatus according to claim 15, wherein the circuit block latches the input data with each edge of the multi-strobe signal,
and wherein the circuit block performs processing on each data thus latched.

21. A test apparatus according to claim 19, wherein the frequency counter measures the frequency for a predetermined period after the multi-strobe detection unit detects stopping of generation of the multi-strobe signal, so as to generate the state detection signal when the load balance circuit is in the active state,
and wherein the frequency counter measures the frequency for a predetermined period when the load balance circuit is in the inactive state, so as to generate the state detection signal when the load balance circuit is in the inactive state,
and wherein the power control circuit adjusts the power consumption due to the load balance circuit such that the difference in the frequency between the active and the inactive state of the load balance circuit becomes minimal.

* * * * *